United States Patent
Kasahara

(10) Patent No.: US 10,964,538 B2
(45) Date of Patent: Mar. 30, 2021

(54) METHOD OF MANUFACTURING SEMICONDUCTOR DEVICE

(71) Applicant: Toshiba Memory Corporation, Tokyo (JP)

(72) Inventor: Yusuke Kasahara, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 5 days.

(21) Appl. No.: 15/896,148

(22) Filed: Feb. 14, 2018

(65) Prior Publication Data
US 2019/0080900 A1 Mar. 14, 2019

(30) Foreign Application Priority Data
Sep. 13, 2017 (JP) .............................. JP2017-176087

(51) Int. Cl.
| H01L 21/027 | (2006.01) |
| H01L 21/311 | (2006.01) |
| H01L 21/308 | (2006.01) |
| H01L 21/3115 | (2006.01) |

(52) U.S. Cl.
CPC .... *H01L 21/0273* (2013.01); *H01L 21/31144* (2013.01); *H01L 21/3086* (2013.01); *H01L 21/3115* (2013.01)

(58) Field of Classification Search
None
See application file for complete search history.

(56) References Cited

FOREIGN PATENT DOCUMENTS

| JP | H03-174724 | 7/1991 |
| JP | H08-31720 | 2/1996 |
| JP | 2012-204456 A | 10/2012 |

*Primary Examiner* — Jack S Chen
(74) *Attorney, Agent, or Firm* — Finnegan, Henderson, Farabow, Garrett & Dunner L.L.P.

(57) ABSTRACT

In one embodiment, a method of manufacturing a semiconductor device includes forming a first film on a substrate. The method further includes forming a second film that contains carbon on the first film, and processing the second film into a second pattern. The method further includes impregnating a metal element or a semiconductor element into the second pattern after the processing into the second pattern. The method further includes processing the first film into a first pattern using the second pattern after the impregnation of the metal element or the semiconductor element.

20 Claims, 5 Drawing Sheets

METHOD OF MANUFACTURING SEMICONDUCTOR DEVICE

CROSS REFERENCE TO RELATED APPLICATION

This application is based upon and claims the benefit of priority from the prior Japanese Patent Application No. 2017-176087, filed on Sep. 13, 2017, the entire contents of which are incorporated herein by reference.

FIELD

Embodiments described herein relate to a method of manufacturing a semiconductor device.

BACKGROUND

When an organic film is to be used as an etching mask, it is considered to impregnate a metal element into the organic film to enhance etching resistance of the organic film.

DETAILED DESCRIPTION

Embodiments will now be explained with reference to the accompanying drawings.

In one embodiment, a method of manufacturing a semiconductor device includes forming a first film on a substrate. The method further includes forming a second film that contains carbon on the first film, and processing the second film into a second pattern. The method further includes impregnating a metal element or a semiconductor element into the second pattern after the processing into the second pattern. The method further includes processing the first film into a first pattern using the second pattern after the impregnation of the metal element or the semiconductor element.

First Embodiment

FIGS. 1A to 3C are cross-sectional views showing a method of manufacturing a semiconductor device of a first embodiment.

Figure 1A:
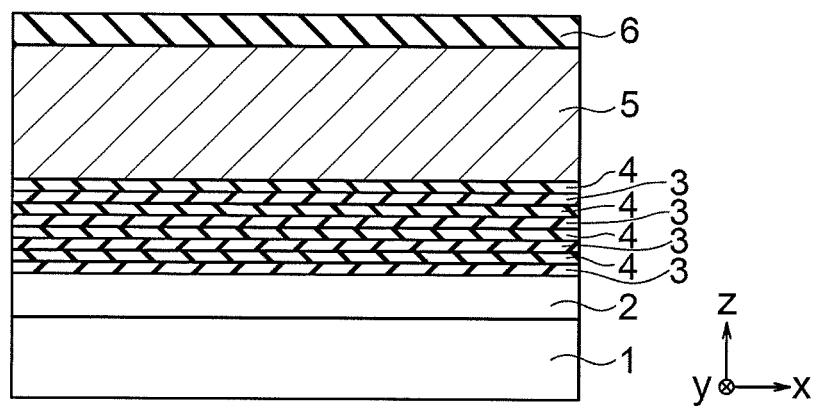
FIGS. 1A to 3C are cross-sectional views showing a method of manufacturing a semiconductor device of a first embodiment.

First, an inter layer dielectric 2 is formed on a substrate 1, and a plurality of first insulating layers 3 and a plurality of second insulating layers 4 are alternately stacked on the inter layer dielectric 2 (FIG. 1A). A stacked film including the first and second insulating layers 3 and 4 is an example of a first film. Next, an organic film 5 and a cover film 6 are sequentially formed on this stacked film (FIG. 1A). The organic film 5 and the cover film 6 are examples of a second film and a third film, respectively.

An example of the substrate 1 is a semiconductor substrate such as a silicon (Si) substrate. An example of the inter layer dielectric 2 is a silicon oxide film ($SiO_2$) or a silicon nitride film (SiN). FIG. 1A shows an X-direction and a Y-direction that are parallel to a surface of the substrate 1 and perpendicular to each other, and a Z-direction that is perpendicular to the surface of the substrate 1. In this specification, the +Z-direction is handled as the upward direction, and the −Z-direction is handled as the downward direction. The −Z-direction may coincide with the direction of gravity or may not coincide with the direction of gravity.

The first insulating layers 3 are, for example, silicon oxide films each having 30 nm of thickness. The second insulating layers 4 are, for example, silicon nitride films each having 50 nm of thickness. The stacked film of the present embodiment includes 48 first insulating layers 3 and 48 second insulating layers 4, and totally has 3840 nm of thickness. This stacked film is a workpiece film of etching. The workpiece film may be a single layer film instead of the stacked film. Moreover, the workpiece film may be directly formed on the substrate 1 instead of being formed on the inter layer dielectric 2. The staked film of the present embodiment may be a stacked film that alternately includes a plurality of insulating films and a plurality of conductive films.

The organic film 5 is a film containing carbon, for example, a polymethyl methacrylate (PMMA) film. The organic film 5 of the present embodiment has 1000 nm of thickness and is formed by spin coating. In a case where the organic film 5 is formed by spin coating, although the upper limit of its thickness is limited to approximately 1000 nm, the organic film 5 can be inexpensively and easily formed.

The cover film 6 is, for example, a spin on glass (SOG) film. The cover film 6 of the present embodiment has 70 nm of thickness and is formed by spin coating.

Figure 1B:
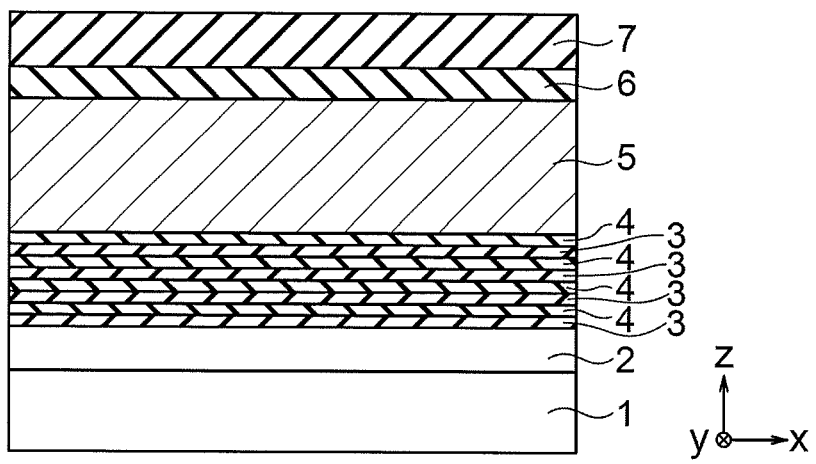

An antireflective coating 7 is then formed on the cover film 6 (FIG. 1B). For example, the antireflective coating 7 has 60 nm of thickness and is formed by spin coating. In the present embodiment, by forming the antireflective coating 7 above the organic film 5, an antireflective function is not necessarily given to the organic film 5, which makes a material of the organic film 5 freely selected. For example, a material that is easily impregnated with a metal element or a semiconductor element can be selected as the material of the organic film 5.

Figure 2A:
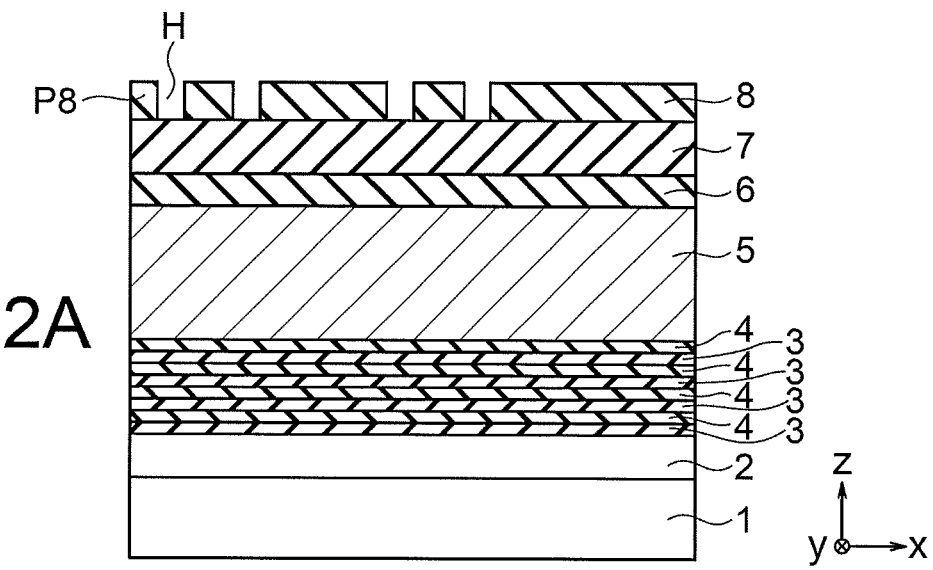

A resist film 8 is then formed on the antireflective coating 7, and the resist film 8 is patterned using an ArF immersion lithography machine (FIG. 2A). As a result, a plurality of openings H are formed in the resist film 8, and a resist pattern P8 is formed in the resist film 8. A distance between the openings H is, for example, approximately 100 nm in the region where the openings H are densest.

In the process of FIG. 2A, the resist film 8 may be processed into a plurality of resist patterns P8 or may be processed into one resist pattern P8. The resist patterns P8 in the former case are formed when the openings H are space patterns that form a line and space (L/S) pattern, for example. The resist pattern P8 in the latter case is formed when the openings H are hole patterns, for example. The openings H of the present embodiment are hole patterns for forming a plurality of holes in the stacked film, and the resist film 8 is processed into one resist pattern P8.

Figure 2B:
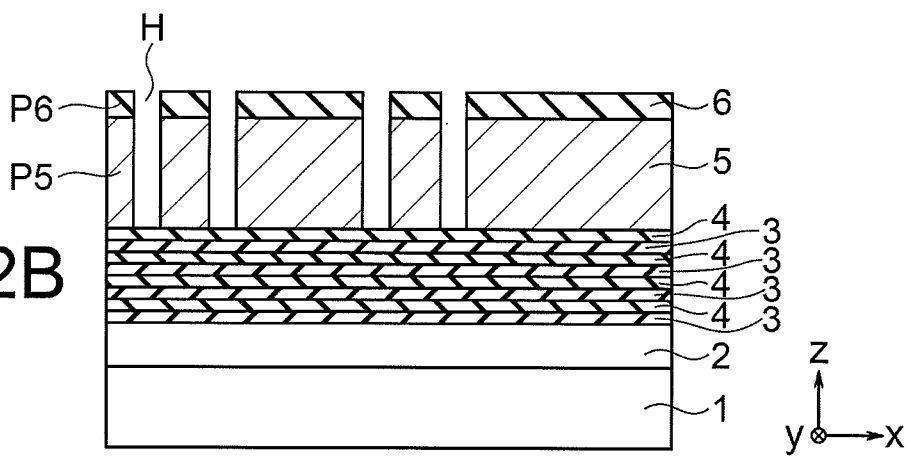

The antireflective coating 7 and the cover film 6 are then etched by reactive ion etching (RIE) using the resist film 8 as a mask, and the organic film 5 is etched by RIE using the cover film 6 as a mask (FIG. 2B). As a result, the openings H penetrate the antireflective coating 7, the cover film 6 and the organic film 5. The resist pattern P8 is transferred to the antireflective coating 7, the cover film 6 and the organic film 5. FIG. 2B shows a pattern P6 formed in the cover film 6 and a pattern P5 formed in the organic film 5. The pattern P6 is an example of a third pattern. The pattern P5 is an example of a second pattern. Hereafter, the pattern P5 is expressed as an "organic film pattern P5".

Figure 2C:
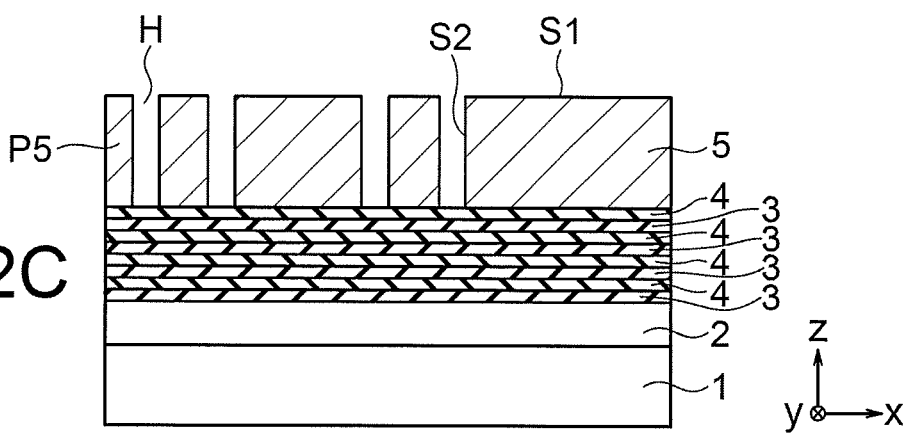

The cover film 6 on the organic film 5 is then removed (FIG. 2C). The cover film 6 is removed in order to make the organic film pattern P5 easily impregnated with the metal element or the semiconductor element. Although this process can be omitted, this process is desirably performed in order to promote the impregnation more since the impregnation of the metal element or the semiconductor element proceeds not only from an upper face S1 of the organic film pattern P5 but also from a lateral face S2 of the organic film pattern P5.

Figure 3A:
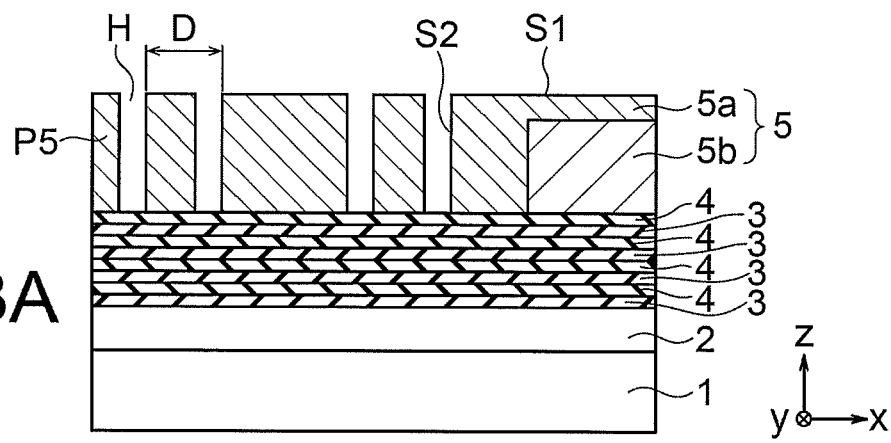

Next, the metal element or the semiconductor element is impregnated into the organic film pattern P5 (FIG. 3A). In the present embodiment, a trimethylaluminum (TMA) gas is used to impregnate aluminum (Al) into the organic film pattern P5 from the upper face S1 and the lateral face S2 of the organic film pattern P5. Thereby, etching resistance of the organic film pattern P5 can be enhanced. Hereafter, a specific example of this metal impregnation treatment will be described.

In the metal impregnation treatment, the substrate 1 is placed in a vacuum chamber that is an example of a vacuum vessel. The temperature of the substrate 1 is set to be 100° C. Next, the TMA gas is introduced into the vacuum chamber. The pressure in the vacuum chamber is set to be 100 Pa. Thereby, the organic film pattern P5 is exposed to the TMA gas, and the TMA gas is impregnated into the organic film pattern P5 from the upper face S1 and the lateral face S2 of the organic film pattern P5. The exposure to the TMA gas is continued for five minutes.

After the end of the exposure to the TMA gas, the vacuum chamber is evacuated to a vacuum to discharge the TMA gas from the vacuum chamber. Water vapor ($H_2O$) is then introduced into the vacuum chamber. The pressure in the vacuum chamber is set to be 250 Pa. Thereby, TMA and water react, and aluminum oxide is fixed into the organic film pattern P5.

In this way, the metal impregnation treatment includes a first process that exposes the organic film pattern P5 to the TMA gas, and a second process that exposes the organic film pattern P5 to the water vapor. In this stage, only one first process and one second process may be performed, or a plurality of first processes and a plurality of second processes may be alternately repeated. In the present embodiment, only one first process and one second process are performed to set an average concentration of Al atoms in the organic film pattern P5 to be approximately 30%. In the case where the average concentration of Al atoms is wanted to be raised more, a plurality of first processes and a plurality of second processes may be alternately repeated.

The TMA gas is impregnated from the upper face S1 and the lateral face S2 of the organic film pattern P5. Therefore, the concentration of Al atoms at each site in the organic film pattern P5 changes depending on a distance from the upper face S1 and a distance from the lateral face S2. For example, the concentration of Al atoms is low at a site distant from both the upper face S1 and the lateral face S2. As a result, a concentration gradient of the concentration of Al atoms arises in the organic film pattern P5.

In the metal impregnation treatment of the present embodiment, the TMA gas is impregnated into the organic film pattern P5 by a distance of approximately 200 nm from the upper face S1 or the lateral face S2. The thickness of the organic film 5 of the present embodiment is 1000 nm. Therefore, if the metal impregnation treatment is performed before forming the organic film pattern P5, the TMA gas is not impregnated into a bottom region (region for 800 nm) in the organic film 5. Namely, the bottom region in the organic film 5 is not metalized. As a result, etching resistance of the bottom region becomes low, which causes the bottom region to be etched from the lateral face S2 or causes a shortage of the mask when the stacked film is etched using the organic film pattern P5 as a mask.

However, in the present embodiment, the metal impregnation treatment is performed after forming the organic film pattern P5. Therefore, not only a region near the upper face S1 of the organic film pattern P5 but also a region near the lateral face S2 of the organic film pattern P5 are metallized. Therefore, when the stacked film is etched using the organic film pattern P5 as a mask, the bottom region can be suppressed from being etched from the lateral face S2, and the shortage of the mask can be suppressed.

FIG. 3A shows a metal impregnation region 5a and a metal non-impregnation region 5b formed in the organic film 5. The metal impregnation region 5a is impregnated with TMA gas. The metal non-impregnation region 5b is not impregnated with TMA gas.

As shown in FIG. 3A, dense pitch portions in the organic film pattern P5 do not include the metal non-impregnation region 5b, and all of these portions are impregnated with metal. Therefore, the dense pitch portions in the present embodiment can be suppressed from being etched. Meanwhile, coarse pitch portions in the organic film pattern P5 include the metal non-impregnation region 5b. However, since the lateral faces S2 of the coarse pitch portions are metallized and the coarse pitch portions are low in etching rate, the coarse pitch portions in the present embodiment can also function as a mask.

Sign D designates a pitch of portions that form the organic film pattern P5. It is considered that the metal impregnation treatment of the present embodiment is often needed in the case where this pitch is small. For example, when the minimum pitch of the portions that form the organic film pattern P5 is 500 nm or less, the metal impregnation treatment of the present embodiment is considered to be needed. In the present embodiment, the distance between the openings H is approximately 100 nm in the region where the openings H are densest. Therefore, the minimum pitch of the portions that form the organic film pattern P5 is still approximately hundreds of nanometers.

Figure 3B:
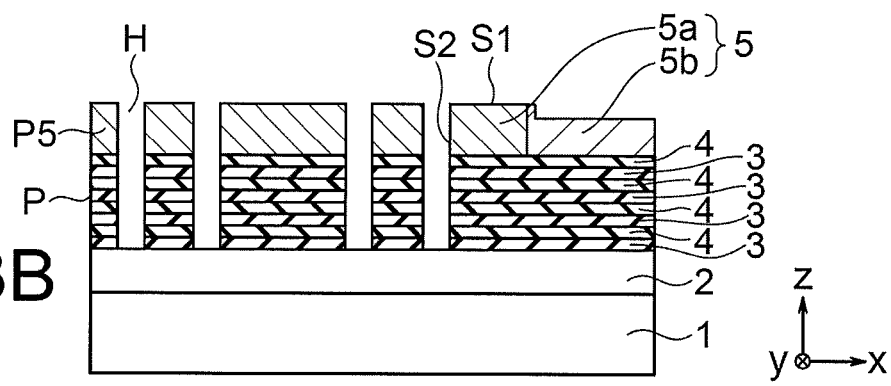

The stacked film including the first and second insulating layers 3 and 4 is then etched by RIE using the organic film 5 as a mask (FIG. 3B). As a result, the openings H penetrate the stacked film, and the organic film pattern P5 is transferred to the stacked film. FIG. 3B shows a stacked film pattern P formed in the stacked film. The stacked film pattern P is an example of a first pattern.

FIG. 3B shows the organic film 5 that has partially removed by this RIE. Note that the metal non-impregnation region 5b is largely etched. The reason is that the metal non-impregnation region 5b is more easily etched than the metal impregnation region 5a. Moreover, the dense pitch portions are sometimes recessed near the openings H due to faster etching therein, depending on etching conditions of the organic film 5, a layout of the organic film pattern P5, a pitch of the organic film pattern P5 and the like.

Figure 3C:
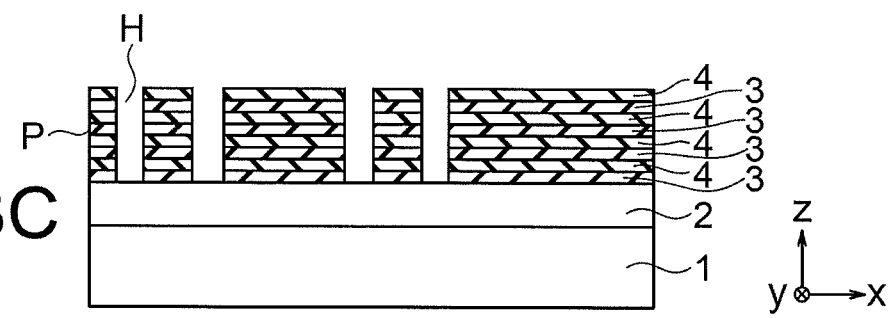

The organic film 5 is then removed by ashing and wet etching (FIG. 3C). In this way, the stacked film which has been processed into a desired shape can be obtained.

The metal impregnation treatment of the present embodiment may be performed using a gas containing a metal element other than aluminum. Examples of such a metal element include titanium (Ti), hafnium (Hf), tungsten (W), tantalum (Ta), ruthenium (Ru), zirconium (Zr) and the like.

The organic film 5 is impregnated with such a metal element, and thereby, etching resistance of the organic film 5 can be enhanced.

Moreover, the metal impregnation treatment of the present embodiment may also be performed using a gas containing a semiconductor element. Examples of such a semiconductor element include silicon (Si), germanium (Ge) and the like. The organic film 5 is impregnated with such a semiconductor element, and thereby, etching resistance of the organic film 5 can be enhanced.

It is considered that the metal impregnation treatment of the present embodiment impregnates the organic film 5 with a metal element or a semiconductor element that belongs to group 4 to group 14 of the periodic table of elements. The reason is that many of the elements of group 1 to group 3 are hard to be used because they are active, and that many of the elements of group 15 to group 18 are hard to be used because they are gases in their elemental substance forms.

FIGS. 4A to 5C are cross-sectional views showing a method of manufacturing a semiconductor device of a comparative example of the first embodiment.

Figure 4A:
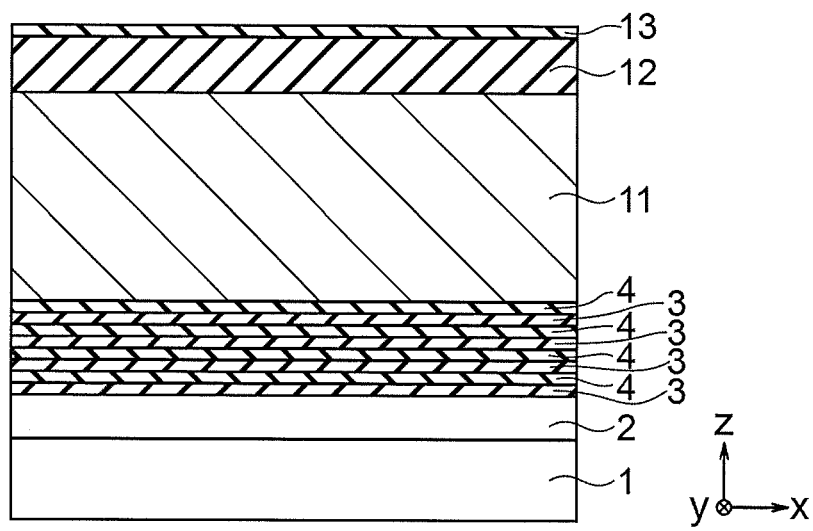
FIGS. 4A to 5C are cross-sectional views showing a method of manufacturing a semiconductor device of a comparative example of the first embodiment.

First, the inter layer dielectric 2 is formed on the substrate 1, and the plurality of first insulating layers 3 and the plurality of second insulating layers 4 are alternately stacked on the inter layer dielectric 2 (FIG. 4A). Next, an organic film 11, a first antireflective coating 12 and a second antireflective coating 13 are sequentially formed on the stacked film that includes the first and second insulating layers 3 and 4 (FIG. 4A). The organic film 11 of this comparative example is a carbon film formed by chemical vapor deposition (CVD).

Figure 4B:
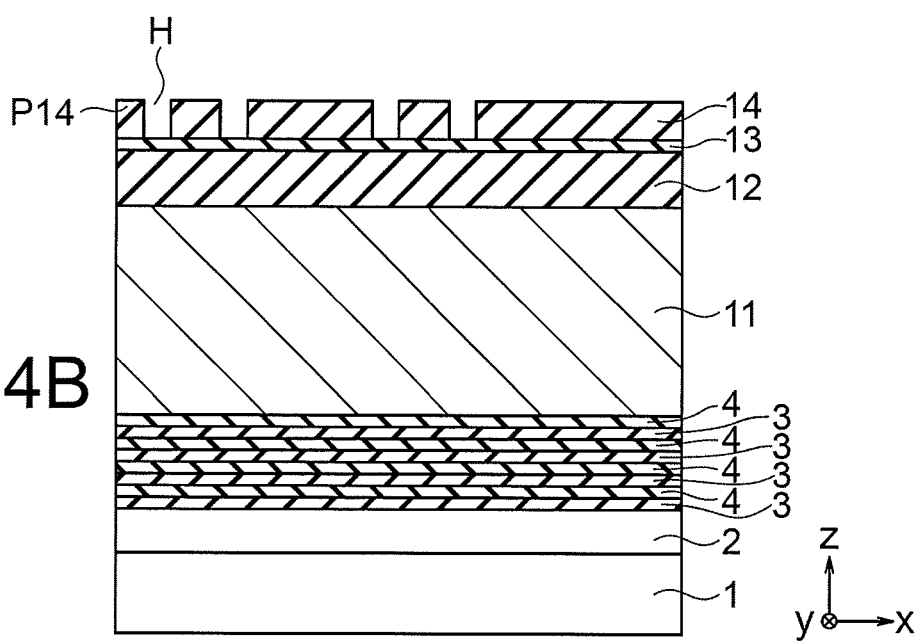

A resist film 14 is then formed on the second antireflective coating 13, and the resist film 14 is patterned (FIG. 4B). As a result, the plurality of openings H are formed in the resist film 14, and a resist pattern P14 is formed in the resist film 14.

Figure 5A:
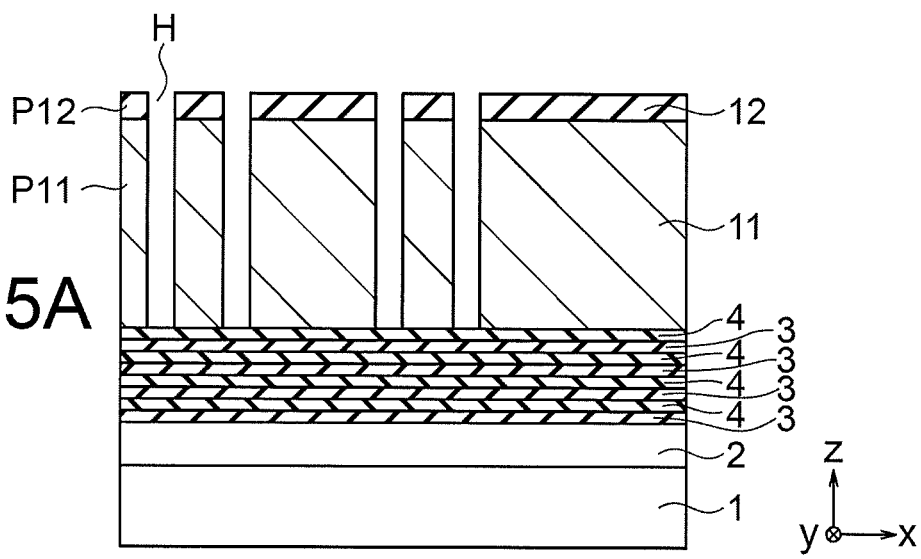

Next, the second antireflective coating 13, the first antireflective coating 12 and the organic film 11 are etched by RIE using the resist film 14 as a mask (FIG. 5A). As a result, the openings H penetrate the second antireflective coating 13, the first antireflective coating 12 and the organic film 11. The resist pattern P14 is transferred to the second antireflective coating 13, the first antireflective coating 12 and the organic film 11. FIG. 5A shows a pattern P12 formed in the first antireflective coating 12, and an organic film pattern P11 formed in the organic film 11.

Figure 5B:
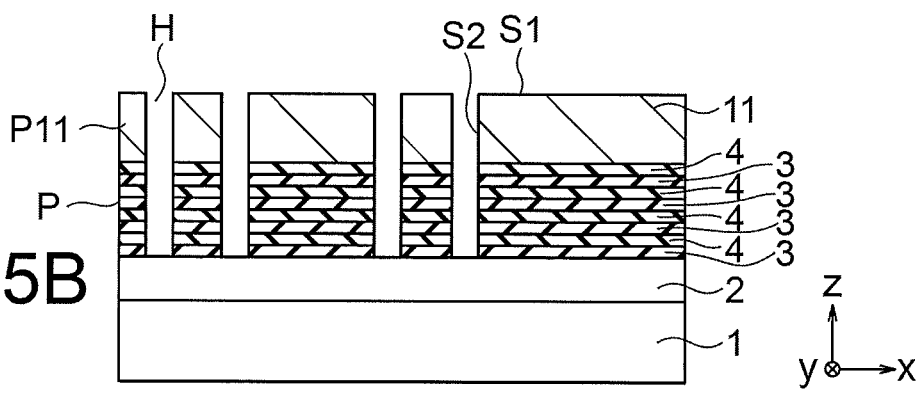
Figure 5C:
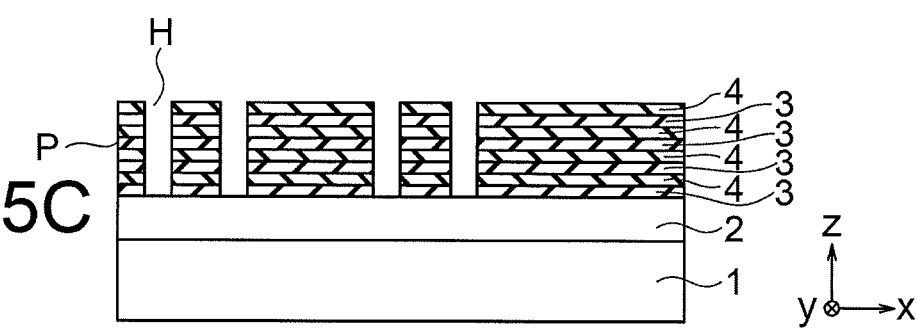

Next, the stacked film including the first and second insulating layers 3 and 4 is etched by RIE using the organic film 11 as a mask (FIG. 5B). As a result, the openings H penetrate the stacked film, and the organic film pattern P11 is transferred to the stacked film. FIG. 5B shows a stacked film pattern P formed in the stacked film. The organic film 11 is then removed (FIG. 5C).

In this comparative example, since the organic film 11 is not metallized, etching resistance of the organic film 11 is low. Therefore, the organic film 11 is needed to be thicker as the stacked film is thicker. In this case, when the thickness of the organic film 11 exceeds 1000 nm, the organic film 11 cannot be formed by spin coating. Therefore, the organic film 11 of this comparative example is formed by CVD, not by spin coating. As a result, costs and loads for forming the organic film 11 become large.

Accordingly, it is considered to metalize the organic film 11. However, the metallization of the organic film 11 before its processing into the organic film pattern P11 causes a problem that a bottom region in the organic film 11 is not metallized. In this case, etching resistance of the bottom region becomes low, which causes the bottom region to be etched from the lateral face S2 or causes the shortage of the mask when the stacked film is etched using the organic film pattern P11 as a mask.

Therefore, the organic film 5 in the present embodiment is metallized after its processing into the organic film pattern P5. Thereby, the lateral face S2 of the bottom region in the organic film 5 can be metalized, which can suppress the bottom region from being etched from the lateral face S2.

As described above, the metal impregnation treatment in the present embodiment is performed after processing the organic film 5 into the organic film pattern P5. Also, after performing the metal impregnation treatment, the stacked film is processed using the organic film pattern P5 as a mask. Thereby, a metal element can be impregnated into the organic film pattern P5 from the upper face S1 and the lateral face S2 of the organic film pattern P5, which can enhance etching resistance of the organic film pattern P5. This can be easily and inexpensively realized by changing the timing of performing the metal impregnation treatment from the timing before the processing into the organic film pattern P5 to the timing after the processing into the organic film pattern P5. Therefore, according to the present embodiment, an etching mask having high etching resistance can be easily formed.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
   forming a first film on a substrate;
   forming a second film that contains carbon on the first film;
   forming a third film on the second film;
   processing the third film into a third pattern;
   processing the second film into a second pattern using the third pattern;
   impregnating a metal element or a semiconductor element into the second pattern after the processing into the second pattern; and
   processing the first film into a first pattern using the second pattern after the impregnation of the metal element or the semiconductor element.

2. The method of claim 1, further comprising removing the third film after the processing into the second pattern, wherein the metal element or the semiconductor element is impregnated into the second pattern after the removal of the third film.

3. The method of claim 1, wherein the third film is formed by spin coating.

4. The method of claim 1, wherein the processing into the third pattern comprises:
   forming an antireflective coating on the third film, and
   processing the third film into the third pattern after the antireflective coating is formed.

5. The method of claim 1, wherein a minimum pitch of portions that form the second pattern is 500 nm or less.

6. The method of claim 1, wherein the second film is a polymethyl methacrylate (PMMA) film.

7. The method of claim 1, wherein the second film is formed by spin coating.

8. The method of claim 1, wherein the first film includes a plurality of first insulating layers and a plurality of second insulating layers that are alternately formed on the substrate.

9. The method of claim 1, wherein the impregnation of the metal element or the semiconductor element is performed in a vacuum vessel.

10. The method of claim 1, wherein the impregnation of the metal element or the semiconductor element is performed using a gas that contains the metal element or the semiconductor element.

11. The method of claim 1, wherein the metal element or the semiconductor element belongs to group 4 to group 14 of the periodic table of elements.

12. The method of claim 1, wherein the metal element is titanium (Ti), hafnium (Hf), tungsten (W), tantalum (Ta), ruthenium (Ru) or zirconium (Zr).

13. The method of claim 1, wherein the semiconductor element is silicon (Si) or germanium (Ge).

14. The method of claim 1, wherein the metal element or the semiconductor element is impregnated such that a concentration of the metal element or the semiconductor element changes depending on a distance from an upper face of the second pattern and a distance from a lateral face of the second pattern.

15. The method of claim 1, wherein the impregnation of the metal element or the semiconductor element comprises:
exposing the second pattern to a first gas containing a first component that includes the metal element or the semiconductor element, and
exposing the second pattern to a second gas containing a second component that reacts with the first component.

16. The method of claim 15, wherein
the exposure to the first gas and the exposure to the second gas are performed in a vacuum vessel, and
the vacuum vessel is evacuated to a vacuum between the exposure to the first gas and the exposure to the second gas.

17. The method of claim 15, wherein the impregnation of the metal element or the semiconductor element is performed to alternately repeat:
a plurality of first processes that expose the second pattern to the first gas, and
a plurality of second processes that expose the second pattern to the second gas.

18. The method of claim 15, wherein the second component oxidizes the first component.

19. The method of claim 15, wherein the second gas is water vapor.

20. A method of manufacturing a semiconductor device, comprising:
forming a first film on a substrate;
forming a second film that contains carbon on the first film;
processing the second film into a second pattern;
impregnating a metal element or a semiconductor element into the second pattern after the processing into the second pattern; and
processing the first film into a first pattern using the second pattern after the impregnation of the metal element or the semiconductor element,
wherein the impregnation of the metal element or the semiconductor element comprises:
exposing the second pattern to a first gas containing a first component that includes the metal element or the semiconductor element, and
exposing the second pattern to a second gas containing a second component that reacts with the first component.

* * * * *